(12) United States Patent
Kim

(10) Patent No.: US 6,738,295 B2
(45) Date of Patent: May 18, 2004

(54) SEMICONDUCTOR MEMORY DEVICE AND ASSOCIATED DATA READ METHOD

(75) Inventor: Doo-Yeul Kim, Kyungki-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/452,003

(22) Filed: May 30, 2003

(65) Prior Publication Data

US 2004/0022118 A1 Feb. 5, 2004

(30) Foreign Application Priority Data

Aug. 1, 2002 (KR) .............................. 10-2002-0045693

(51) Int. Cl.[7] .............................................. G11C 7/00
(52) U.S. Cl. ............. 365/189.05; 365/194; 365/230.08; 365/233
(58) Field of Search ........................... 365/233, 189.05, 365/194, 230.08; 327/158

(56) References Cited

U.S. PATENT DOCUMENTS

| | | | | |
|---|---|---|---|---|
| 5,761,151 A | * | 6/1998 | Hatakeyama | ............ 365/233.5 |
| 6,160,742 A | * | 12/2000 | Chung et al. | .......... 365/189.05 |
| 6,333,895 B1 | * | 12/2001 | Hamamoto et al. | ......... 365/233 |
| 6,347,064 B1 | * | 2/2002 | Seo | ............................. 365/233 |
| 6,510,095 B1 | * | 1/2003 | Matsuzaki et al. | .......... 365/222 |

\* cited by examiner

*Primary Examiner*—Son T. Dinh
(74) *Attorney, Agent, or Firm*—Marger Johnson & McCollom, P.C.

(57) ABSTRACT

The inventive semiconductor memory device includes a data output buffer adapted to receive input data responsive to an on time control signal and adapted to buffer the input data responsive to a latch clock signal. A first clock signal generating means is adapted to generate a first clock signal responsive to a reference signal. A second clock signal generating means is adapted to generate a second clock signal responsive to the first clock signal and a mode signal. A latency signal generating means is adapted to generate a latency signal responsive to the mode signal. A latch clock generating means is adapted to generate the latch clock signal responsive to the second clock signal and the mode signal. And an on time control signal generating means is adapted to generate the on time control signal responsive to the second clock signal and the latency signal.

18 Claims, 8 Drawing Sheets

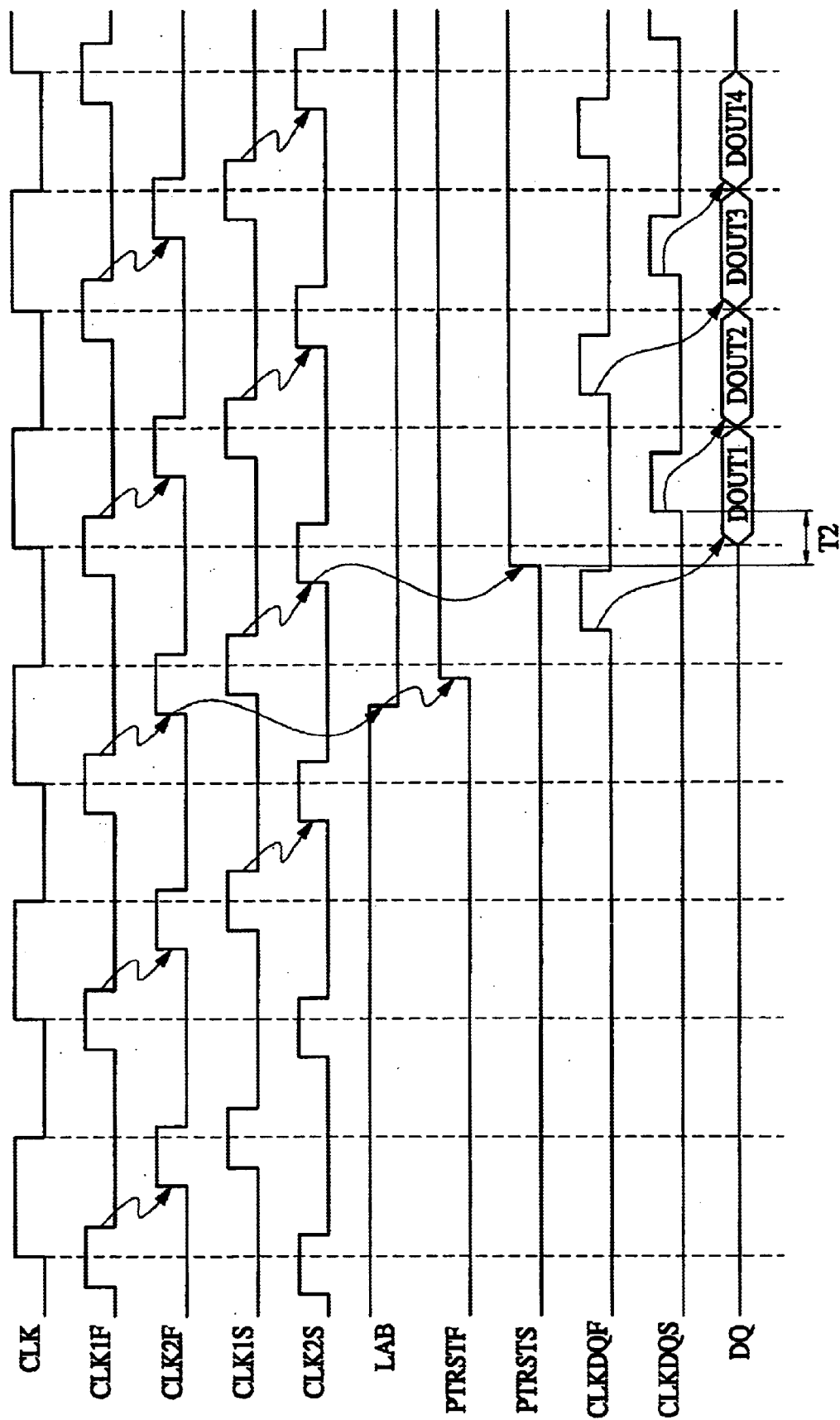

SEMICONDUCTOR MEMORY DEVICE AND ASSOCIATED DATA READ METHOD

This application claims priority from Korean patent application No. 2002-45693 filed Aug. 1, 2002, and incorporated herein by reference.

BACKGROUND OF INVENTION

1. Field of the Invention

The present invention relates to a semiconductor memory device and, more particularly, to a semiconductor memory device capable of accurately reading data and an associated data read method.

2. Description of Related Art

In a double data rate (DDR) semiconductor memory device, an on time control and latch clock signals are generated responsive to an internal clock signal internally generated by a delay locked loop. The on time control signal controls a data output buffer. The latch clock signal determines data latching times are generate.

In a conventional DDR device, the data output buffer latches and outputs data only when the latch clock signal is generated after the on time control signal.

When the conventional DDR device operates at low frequency, the data output buffer properly outputs the data because the on time control signal is generated before the latch clock signal. In contrast, when the DDR device operates at high frequency, the data output buffer does not correctly output the data (e.g., data might be delayed) because the latch clock signal is generated before the on time control signal.

The on time control signal is generated before the latch clock signal during high frequency operation because the on time control signal is generated at a constant frequency without depending on the operating frequency of the semiconductor memory device. The latch clock signal, on the other hand, is generated responsive to the operating frequency of the semiconductor memory device. Accordingly, the latch clock signal might be inadvertently generated before the on time signal where the device operates in high frequency.

FIG. 1 is a block diagram of a data read path in a conventional DDR semiconductor memory device. The conventional DDR device includes a first and a second data banks 10-1 and 10-2, sense amplifiers 12-1 and 12-2, data output buffers 14-1 and 14-2, a data output driver 16, a delay locked loop 20, a latch clock signal CLKDQF, CLFDQS generating circuit 24, a clock signal (CLK2F CLK2S) generating circuit 22, a latency signal (LAB) generating circuit 26, an on time control signal (PTRSTF, PTRSTS) generating circuit 28, and a mode setting circuit 30.

The first memory bank 10-1 reads and writes data responsive to rising edge of a clock signal. The second memory bank 10-2 reads and writes data responsive to the falling edge of the clock signal (not shown).

The sense amplifier 12-1 amplifies the data read out from the first memory bank 10-1 and the sense amplifier 12-2 amplifies the data read out from the second memory bank 10-2.

The data output buffer 14-1 receives an output signal of the sense amplifier 12-1 responsive to the on time control signal PTRSTF, and then buffers and outputs the received signal responsive to the latch clock signal CLKDQF. The data output buffer 14-2 receives an output signal of the sense amplifier 12-2 responsive to the on time control signal PTRSTF, and then buffers and outputs the received signal responsive to the latch clock signal CLKDQS.

The delay locked loop 20 receives the clock signal CLK and generates the clock signals CLK1F, CLK1S.

The clock signal generating circuit 2 receives the clock signals CLK1F and CLK1S and generates clock signals CLK2F and CLK2S. The latch clock signal generating circuit 24 generates the latch clock signals CLKDQF and CLKDQS responsive to the clock signals CLK1F, CLK1S and the column address strobe (CAS) latency signals CL1.5, CL2, CL2.5, CL3.

The latency signal generating circuit 26 generates a latency signal LAB responsive to the CAS latency signals CL1.5, CL2, CL2.5 and CL3 and the clock signals CLK2F and CLK2S.

The on time control signal generating circuit 28 receives the latency signal LAB responsive to the clock signals CLK2F, CLK2S and generates the on time control signals PTRSTF, PTRSTS.

The mode setting circuit 30 receives the CAS latency signals CL1.5, CL2, CL2.5 and CL3 input from address pins (not shown) during a mode setting operation.

FIG. 2 is a circuit diagram of a data output buffer embodiment. The conventional data output buffer comprises a data output buffer 14-1 including an input circuit 14-11 and a buffer/latch circuit 14-12, and a data output buffer 14-2 including an input circuit 14-2 and a buffer/latch circuit 14-22.

The input circuit 14-11 comprises an inverter I1, a NOR gate NOR1 and a NAND gate NA1. The buffer/latch circuit 14-12 comprises an inverter I3, NAND gates NA2 and NA3, NOR gates NOR2 and NOR3, PMOS transistors P1 and P2, NMOS transistors N1 and N2 and a latch L1 comprising inverters I5 and I6.

The input circuit 14-21 comprises an inverter I2, a NOR gate NOR4, and a NAND gate NA4. The buffer/latch circuit 14-22 comprises an inverter I4, NAND gates NA5 and NA6, NOR gates NOR5 and NOR6, PMOS transistors P3 and P4, NMOS transistors N3 and N4, and a latch L2 comprising I7 and I8.

The data output buffers 14-1 and 14-2, each buffer one bit of data DOF or DOS. The data output buffer 14-1 operates as we describe below. The data output buffer 14-2 operates similarly to data output buffer 14-1. T When the on time control signal PTRSTF is at a logic "high" level is, the NOR gate NOR1 and the NAND gate NA1 invert the data DOF. That is, if the data DOF is at a logic "high" level, the NOR gate NOR1 and the NAND gate NA1 output the data DOF at a of logic "low" level. The NAND gates NA2 and NA3 generate logic "high" level signals. Accordingly, the PMOS transistors P1 and P2 are turned off. At this time, if the clock signal CLKDQF has the logic "high" level, the NOR gates NOR2 and NOR3 generate corresponding logic "high" level signals. Accordingly, the NMOS transistors N1 and N2 are turned on and thus logic "low" level signals are generated at a common node of the PMOS transistor P1 and the NMOS transistor N1 and a common node of the PMOS transistor P2 and the NMOS transistor N2. The latches L1 and L2 invert and latch the logic "low" level signal, and then generate signals DOP and DON having logic "high" levels. On the other hand, if the clock signal CLKDQF has logic "low" level, the NAND gates NA2 and NA3 generate corresponding logic "high" level signals and the NOR gates NOR2 and NOR3 generate corresponding logic "low" level signals. Accordingly, the PMOS transistors P1 and P2 and the NMOS transistors N1 and N2 are turned off, and the latches L1 and L2 output the previously latched signals as the data DOP and DON.

On the other hand, when the on time control signal PTRSTF has a logic "low" level, the NOR gate NOR1 generates a logic "low" level signal and the NAND gate NA1 generates a logic "high" level signal. The NAND gate NA2 generates a logic "high" level signal and the NOR gate NOR3 generates a logic "low" level signal. Accordingly, the PMOS transistor P1 and the NMOS transistor N2 are turned off. If the clock signal CLKDQF has the logic "low" level, the NOR gate NOR2 generates a logic "low" level signal and the NAND gate NA3 generates a logic "high" level signal. Accordingly, the NMOS transistor N1 and the PMOS transistor P2 are turned off. The latches L1 and L2 output the latched data DOP and DON, respectively.

As described above, the data output buffer buffers and latches the data DOF and outputs the data DOP and DON.

When the on time control signal PTRSTF is at a logic "low" and the clock signal CLKDQF of the logic "high" level is applied, the NOR gate NOR1 outputs the logic "low" level signal and the NAND gate NA1 outputs the logic "high" level signal, so that the NAND gate NA2 generates logic "high" level signal and the NOR gate NOR3 generates the logic "low" level signal. Further, the NOR gate NOR2 generates the logic "high" level signal and the NAND gate NA3 generates the logic "low" level signal. Accordingly, the NMOS transistor N1 and the PMOS transistor P2 are turned on, and the latches L1 and L2 invert and latch the logic "low" level signal and the logic "high" level signal, respectively, thereby outputting the data DOP having logic "high" level and the data DON having logic "low" level.

Accordingly, if the clock signal CLKDQF is transited to a logic "high" level before the on time control signal PTRSTF is transited to logic "high" level, the data DOP of logic "high" level and the data DON of logic "low" level are generated. Thus, the data output driver in FIG. 1 generates an output signal of high impedance state.

Therefore, if the on time clock signal PTRSTF is generated after the clock signal, the data DOF may be belatedly output or may not be output at all. Accordingly, it is necessary that the on time clock signal be generated before the clock signal is generated to output the data correctly.

FIG. 3 illustrates a circuit diagram of an example of the clock signal generating circuit 22 in FIG. 1. The clock signal generating circuit 22 comprises an inverter I9, a delay circuit 40 comprising inverters I10-I5, NAND gates NA7, NA8 and a delay circuit 42 comprising of inverters I16, I17, I18.

Operation of the clock signal generating circuit is as follows.

The inverter I9 inverts the clock signal CLK1. The delay circuit 40 delays an output signal of the inverter I9. The NAND gate NA7 logically NANDs the output signal of the inverter I9 and an output signal of the delay circuit 40. The NAND gate NA8 generates the clock signal CLK2 by logically NANDing the output signal of the inverter I9 and an output signal of the NAND gate NA7. The delay circuit 42 inverts and delays an output signal of the NAND gate NA8. That is, the inverter I9, the delay circuit 40 and the NAND gates NA7, NA8 in FIG. 3 detects a falling edge of the clock signal CLK1 and generates the clock signal CLK2. The delay circuit 42 inverts and delays the output signal of the NAND gate NA8.

FIG. 4A is a timing diagram of the semiconductor memory device shown in FIG. 1. In FIG. 4A, the CAS latency signal CL3 is 1, a burst length is 4, the clock signal has a high frequency, and a read command is input at a rising edge of a clock signal CLK.

The delay locked loop 20 receives the clock signal CLK as an input and generates the clock signals CLK1F, CLK1S. The clock signal CLK2F, CLK2S generating circuit 22 detects falling edges of the clock signals CLK1F, CLK1S and generates the clock signals CLK2F, CLK2S, respectively. The latency signal generating circuit 26 generates the latency signal LAB responsive to a rising edge of a third clock of the clock signal CLK2F. The on time control signal generating circuit 28 generates the on time clock signals PTRSTF, PTRSTS responsive to the latency signal LAB and the clock signals CLK2F, CLK2S. The latch clock signal generating circuit 24 generates the latch clock signals CLKDQF, CLKDQS responsive to the clock signals CLK1F, CLK1S and the latency signals CL1.5, CL2, CL2.5, CL3.

When the semiconductor memory device is operates with a CAS latency of 3 or greater (that is, the device operates at a high frequency), generation of the on time control signals PTRSTF, PTRSTS is delayed, delaying the generation of on time control signals PTRSTF, PTRSTS to a time T1 after the latch clock signals CLKDQF, CLKDQS are generated. Accordingly, a first and second data DOUT1, DOUT2 are also delayed. Further, if the on time control signals PTRSTF, PTRSTS are generated deviating from the logic "high" level of the first latch clock signals CLKDQF, CLKDQS, the first and second data DOUT1, DOUT2 may not be output. The semiconductor memory device with a CAS latency of less than 3 operates at a low frequency.

FIG. 4B is a timing diagram of the semiconductor memory device shown in FIG. 1. In FIG. 4B, the CAS latency signal CL3 is 1, a burst length is 4, the clock signal has a low frequency and a read command is input at the rising edge of the clock signal CLK. Under these circumstances, the on the control signals PTRSTF, PTRSTS are generated before than the latch clock signals CLKDQF, CLKDQS by a time T2. Accordingly, the data DOUT1, DOUT2, DOUT3, DOUT4 are accurately output.

As shown in FIGS. 4A and 4B, when the semiconductor memory device operates at high frequency, the on time control signals PTRSTF, PTRSTS are generated before the latch clock signals CLKDQF, CLKDQS. Accordingly, the latch clock signals CLKDQF, CLKDQS are generated before the on time control signals PTRSTF, PTRSTS. These conditions delay the data read time and produce erroneous output results.

Where the CAS latency is 3, the semiconductor memory device does not generally operate at a low frequency as shown in FIG. 4B. The timing diagram of FIG. 4B, however, shows that generation of the latch clock signals occurs earlier than generation of the on time control signal with an increase in frequency.

SUMMARY OF THE INVENTION

An object of the present invention is to overcome disadvantages associated with reading prior semiconductor memory devices.

Another object of the present invention is to provide a semiconductor memory device capable of reading data precisely and correctly.

Yet another object of the present invention is to provide a method for reading data precisely and correctly from a semiconductor memory device. A semiconductor memory device includes a data output buffer adapted to receive input data responsive to an on time control signal and adapted to buffer the input data responsive to a latch clock signal. A first clock signal generating means is adapted to generate a first clock signal responsive to a reference signal. A second clock signal generating means is adapted to generate a second clock signal responsive to the first clock signal and a mode signal. A latency signal generating means is adapted to generate a latency signal responsive to the mode signal. A latch clock generating means adapted to generate the latch clock signal responsive to the second clock signal and the mode signal. And an on time control signal generating means adapted to generate the on time control signal responsive to the second clock signal and the latency signal.

The second clock signal generating means is adapted to generate the second clock signal responsive to a falling edge of the first clock signal when the device operates at low frequency. And the second clock signal generating means is adapted to generate the second clock signal by buffering and delaying the first clock signal when the device operates at high frequency.

The second clock signal generating means is adapted to operate differently when the device operates at a low frequency than when the device operates at a high frequency. The second clock generating means includes a pulse signal generating means adapted to generate a pulse signal responsive to a falling edge of the first clock signal. A first delay means is adapted to generate a first delay signal by delaying the first clock signal by a first predetermined time. A switching means is adapted to generate a switching signal by transmitting the pulse signal when the device operates at low frequency or the delayed first clock signal when the device operates at high frequency. And a second delay means is adapted to delay the switching signal by a second predetermined time.

The pulse signal generating means includes an inverting means adapted to generated an inverted first clock signal by inverting the first clock signal. A third delay means is adapted to generate a delayed inverted first clock signal by delaying the inverted first clock signal by a predetermined third time. A first logic means is adapted to generate a first logic signal by logically manipulating the delayed inverted first clock signal and the inverted first clock signal. And a second logic means is adapted to generate a second logic signal by logically manipulating the first logic signal with the inverted first clock signal.

The switching means includes a first transmission gate adapted to transmit the second logic signal responsive to the mode signal. And a second transmission gate is adapted to transmit the first delay signal responsive to the mode signal.

The first and third predetermined times are about equal. And the second predetermined time is longer than the first predetermined time.

A method for reading data from a semiconductor memory device includes generating a first clock signal responsive to an externally applied clock signal, generating a second clock signal responsive to a mode signal, the mode signal indicating whether the device operates at a high or low frequency, generating a latch clock signal responsive to the second clock signal and the mode signal, generating an on time control signal responsive to a latency signal, and reading the data responsive to the second clock signal and the on time control signal.

The method further includes providing a pulse signal when the device operates in the low frequency and providing a delayed signal when the device operates in the high frequency.

The method further includes detecting a falling edge of the first clock signal and buffering and delaying the first clock signal.

BRIEF DESCRIPTION OF THE DRAWINGS

These and other features and advantages of the present invention will be readily apparent to those of ordinary skill in the art upon review of the detailed description that follows when taken in conjunction with the accompanying drawings, in which like reference numerals denote like parts.

FIG. 4A and FIG. 4B are timing diagrams of the operation of the semiconductor memory device shown in FIG. 1.

DETAILED DESCRIPTION OF PREFERRED EMBODIMENTS

Figure 1:
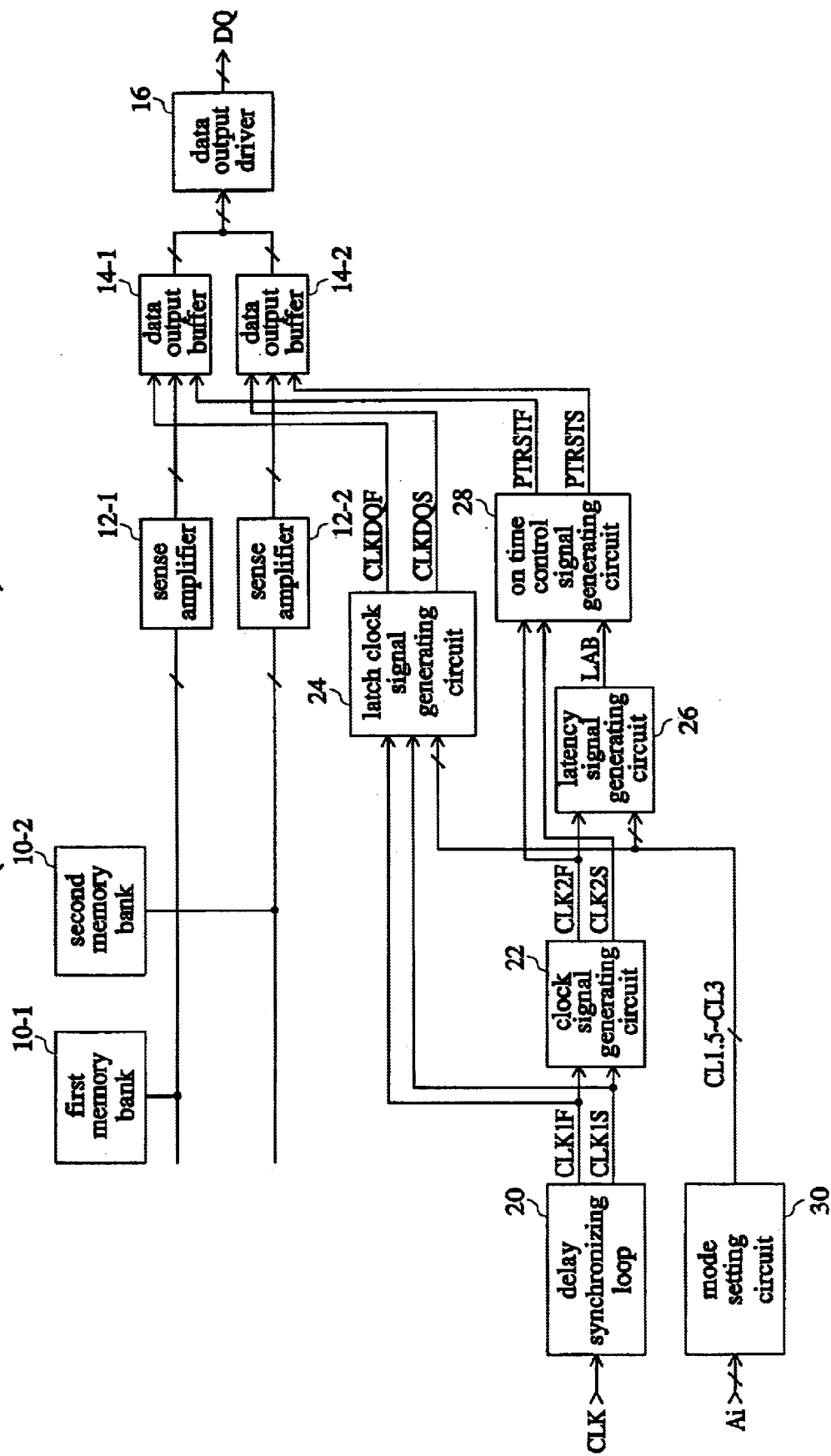
FIG. 1 is a block diagram of a data read path of a DDR semiconductor memory device accordance with the conventional art.
Figure 2:
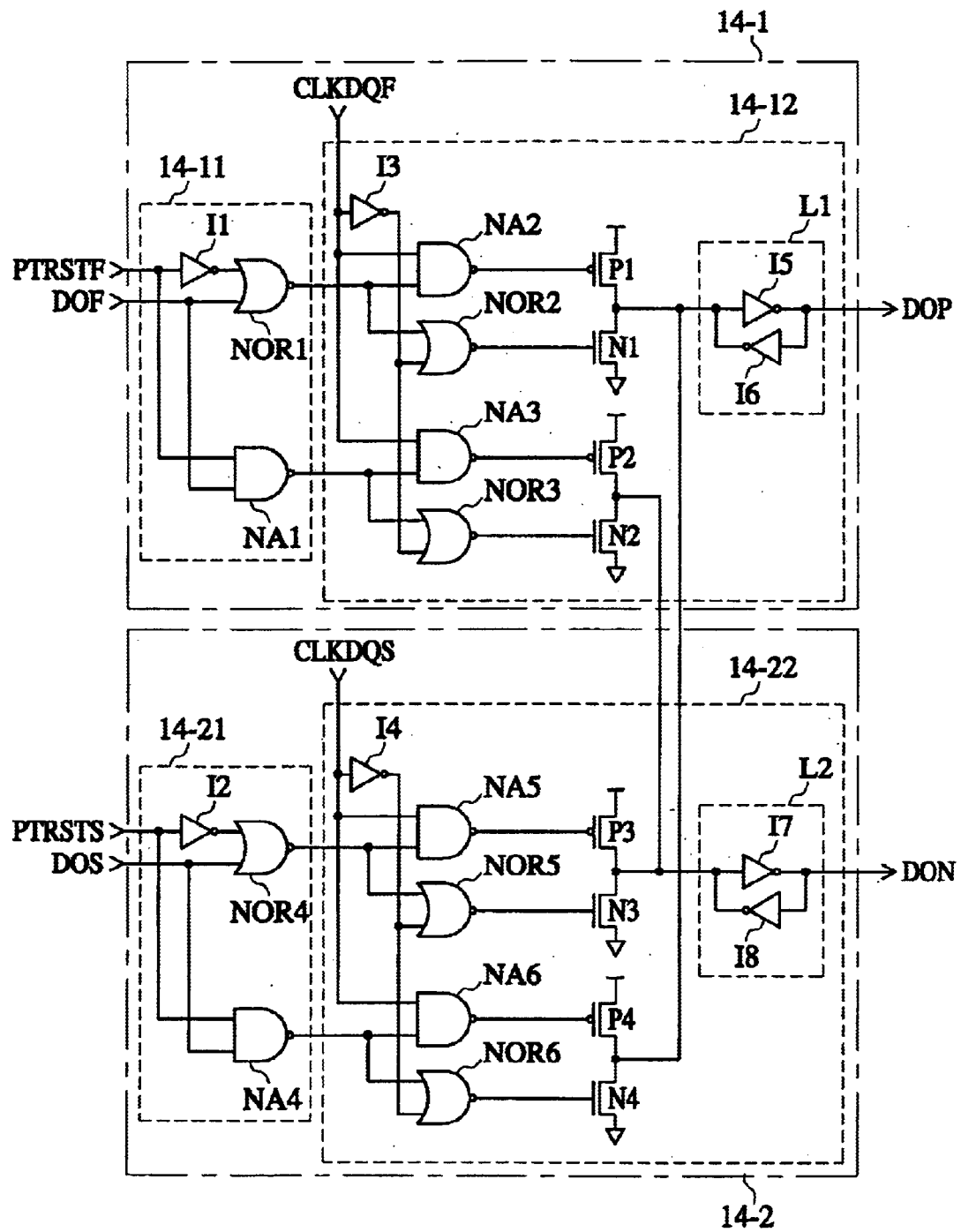
FIG. 2 is a circuit diagram of the data output buffer shown in FIG. 1.
Figure 5:
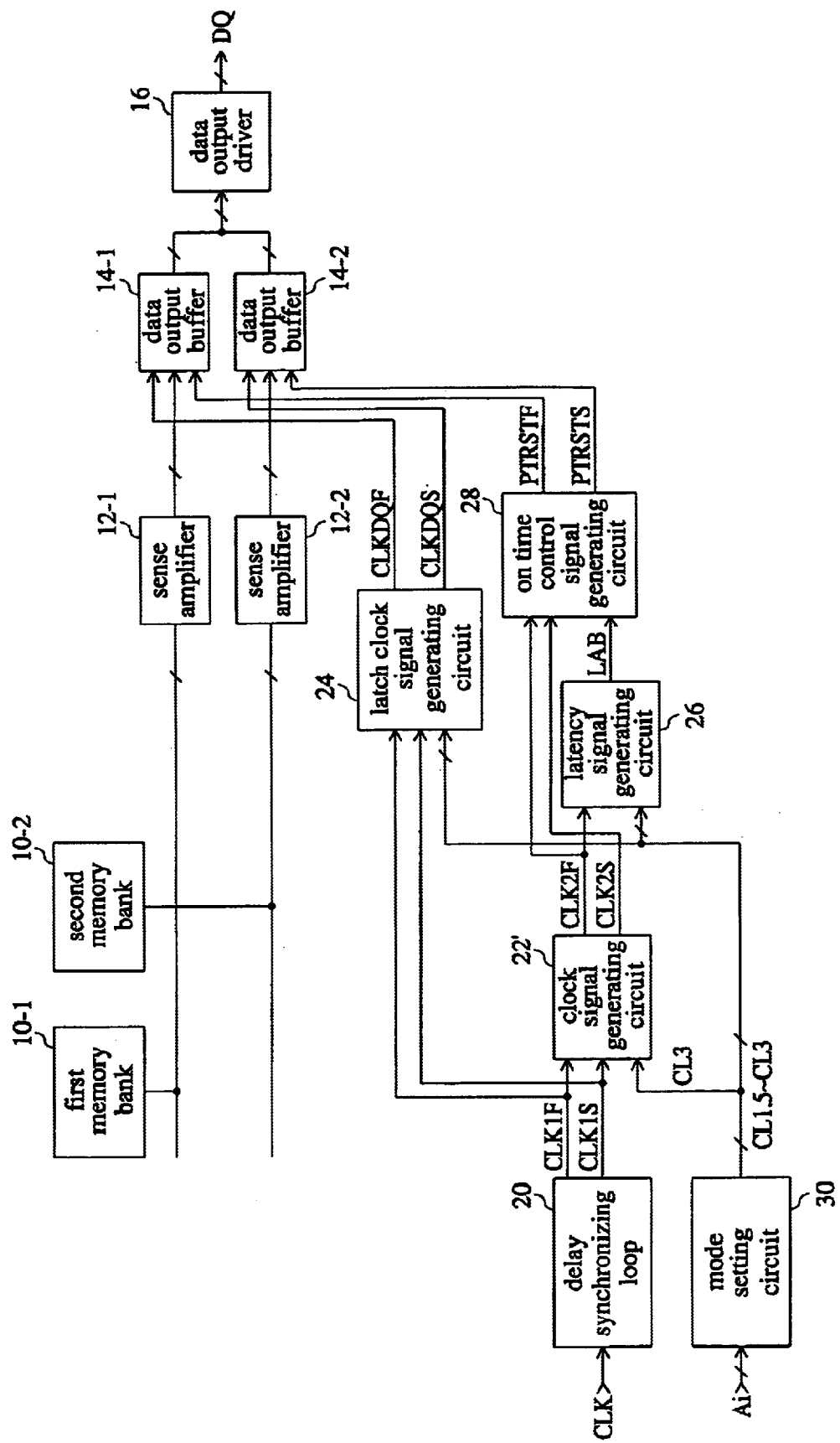
FIG. 5 is a block diagram of an embodiment of a semiconductor memory device in accordance with the present invention.

FIG. 5 is a block diagram of an embodiment of a semiconductor memory device in accordance with the present invention. Identically labeled blocks in FIGS. 1 and 5 operate as described above. Accordingly, a detailed description of the blocks duplicated from the FIG. 1 is omitted for convenience.

The clock signal generating circuit 22' detects and delays falling edges of the second clock signals CLK1F, CLK1S thereby generating the clock signals CLK2F, CLK2S, respectively, when the CAS latency signal CL3 is at a low level. On the other hand, the clock signal generating circuit 22' delays the clock signals CLK1F, CLK1S and generates the clock signals CLK2F, CLK2S, respectively when the CAS latency signal CL3 is at a high level.

Figure 6:
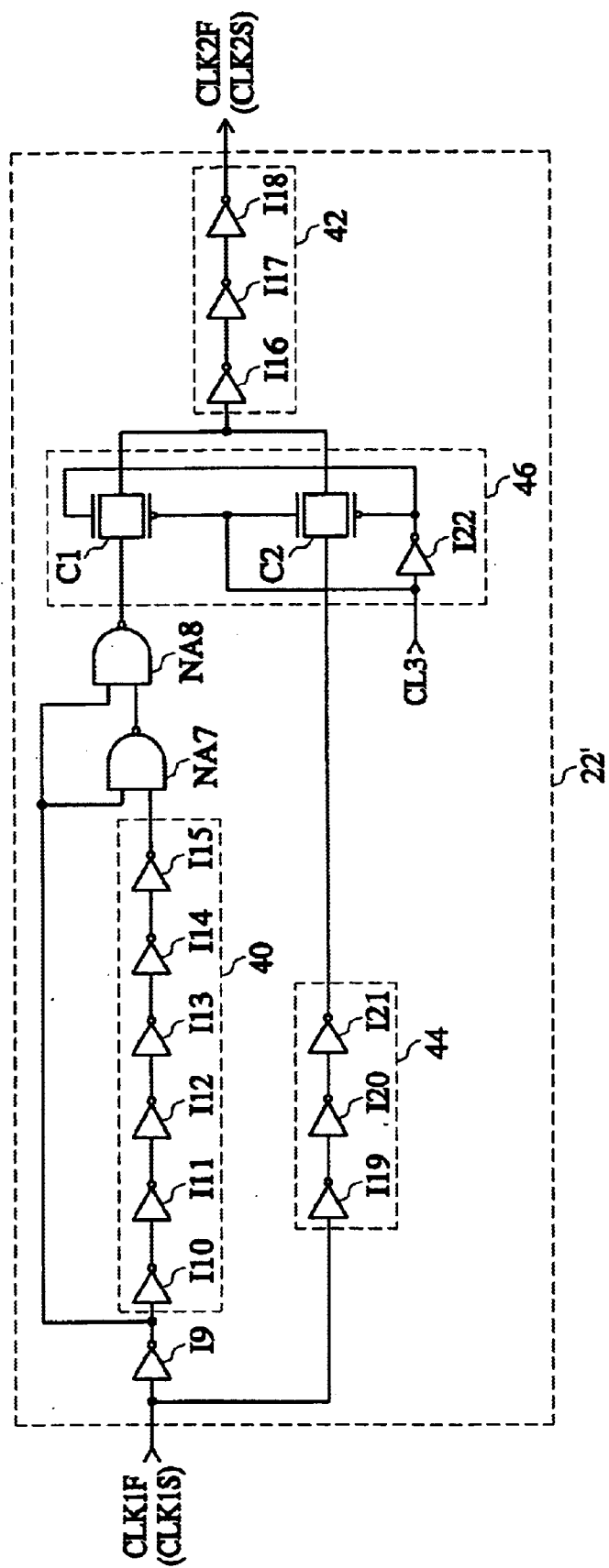
FIG. 6 is a circuit diagram of an embodiment of a clock signal generating circuit.

FIG. 6 is a circuit diagram of an embodiment of the clock signal generating circuit 22'. The clock signal generating circuit 22' includes a delay circuit 44 comprising of inverters I19, I20, I21, a switching circuit 46 comprising of an inverter I22 and CMOS transmission gates C1 and C2, an inverter I9, a delay circuit 40 comprising inverters I10-I5, NAND gate NA7, NA8, and delay circuit 42 comprising inverters I16, I17, I18.

A circuit being comprised of the inverter I9, the delay circuit 40 and the NAND gates NA7, NA8 generates the clock signal by detecting the falling edges of the clock signals CLK1F, CLK1S. The delay circuit 42 inverts and delays an output signal of the switching circuit 46, and generates the clock signals CLK2F, CLK2S. The delay circuit 44 inverts and delays the clock signals CLK1F, CLK1S. The CMOS transmission gate C1 transmits the output signal of the NAND gate NA8 responsive to the CAS latency signal CL3 having a logic "low" level. The CMOS transmission gate C2 transmits the output signal of the delay circuit 44 responsive to the CAS latency signal CL3 of logic "high" level.

Figure 3:
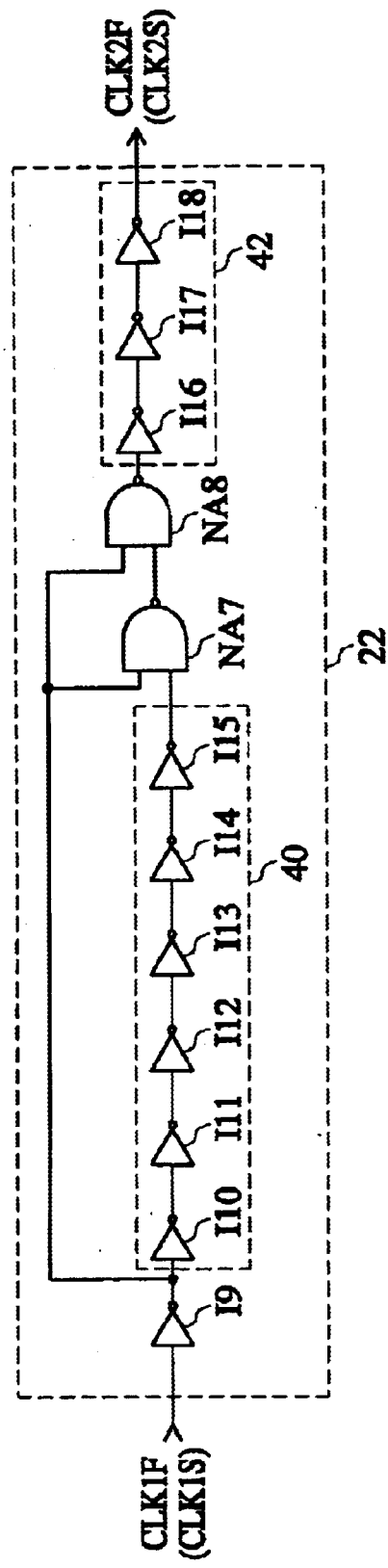
FIG. 3 is a circuit diagram of the clock signal generating circuit shown in FIG. 1.

When the CAS latency signal CL3 is at a low level, the clock signal generating circuit 22' generates the third clock signals CLK2F, CLK2S by inverting and delaying the clock signals generated by detecting the falling edges of the clock signals CLK1F, CLK1S in the same way as the clock signal CLK2F, CLK2S generating circuit 22 in FIG. 3.

In contrast, when the CAS latency signal CL3 is at a high level, the clock signal generating circuit 22' generates the third clock signals CLK2F, CLK2S by directly delaying the clock signals CLK1F, CLK1S.

That is, the clock signal generating circuit 22' is configured such that the timing of the on time control signals PTRSTF, PTRSTS is advanced in the high frequency operation. For example, when the CAS latency signal CL3 is 1, so that generation timing of the on time control signals PTRSTF, PTRSTS in the high frequency operation is prior to the generation timing of the on time control signals PTRSTF, PTRSTS.

Accordingly, the semiconductor memory device in accordance with the present invention is able to precisely output data because the on time control signals PTRSTF, PTRSTS are generated prior to the clock signals CLKDQF, CLKDQS even in the high frequency operation of the semiconductor memory device.

Figure 7:
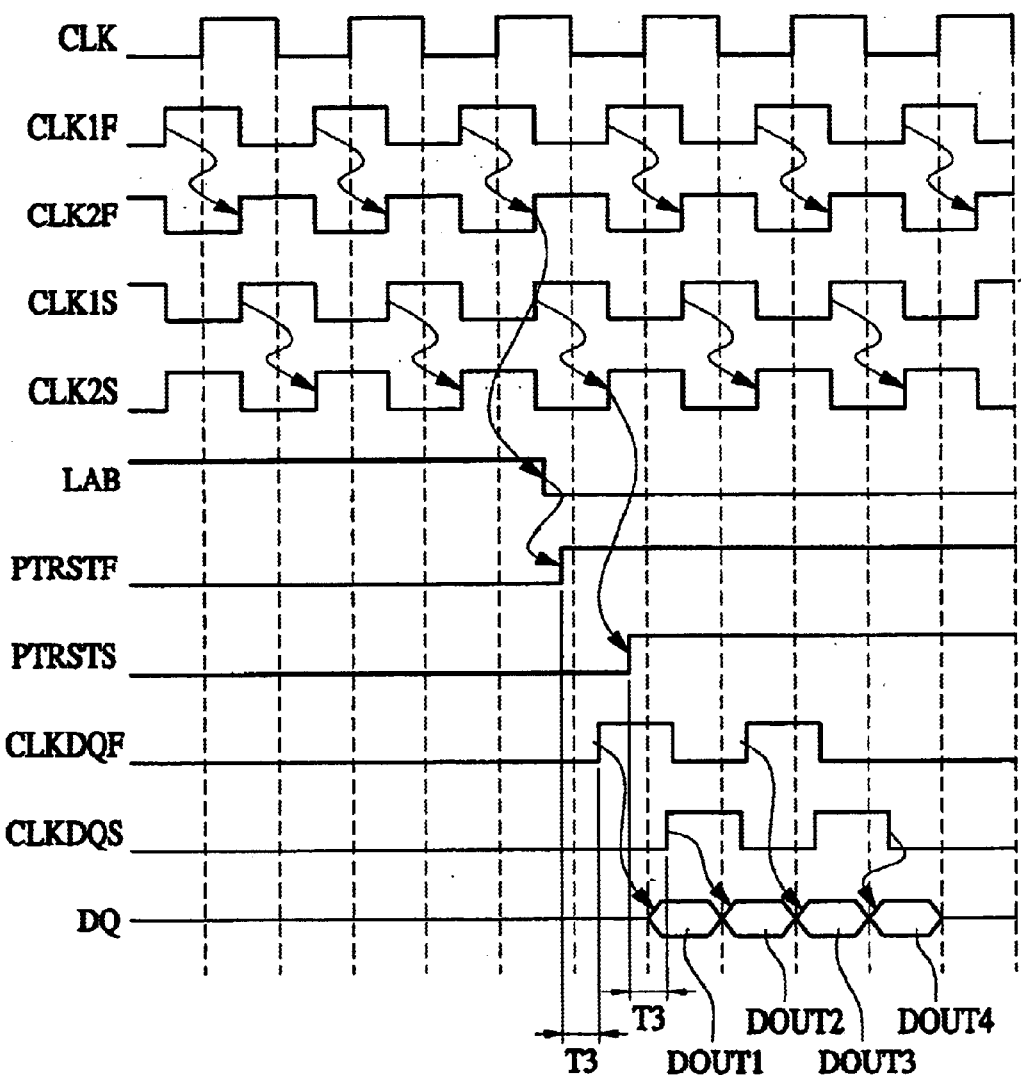
FIG. 7 is a timing diagram of the operation of the semiconductor memory device shown in FIG. 5.

FIG. 7 is a timing diagram associated with the semiconductor memory device in FIG. 5, wherein a read command is input at a rising edge of a first clock of a clock signal CLK, a CAS latency signal CL3 is 1, a burst length is 4, and a clock signal has a low frequency.

Figure 4A:
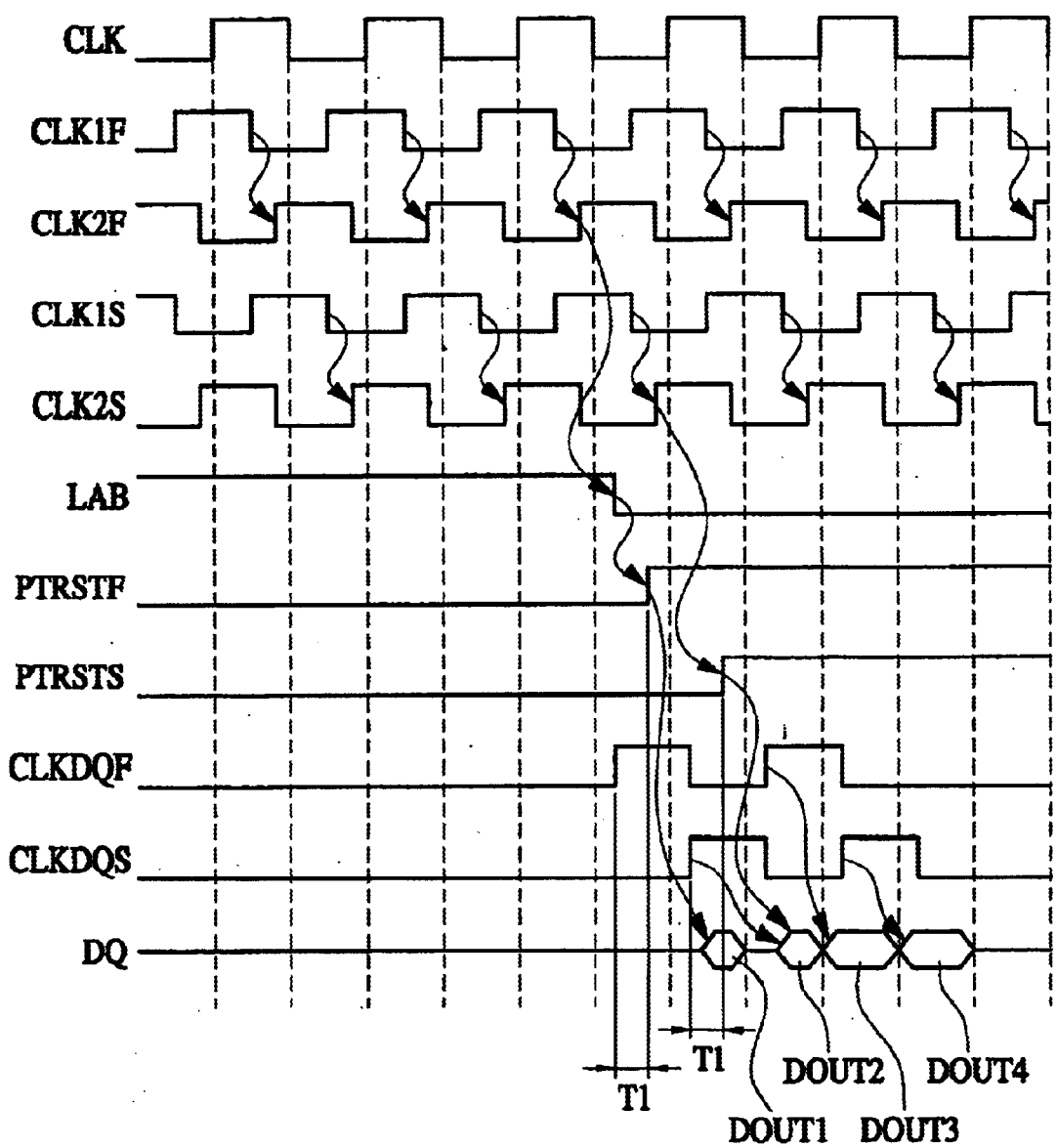

The delay locked loop 20 receives the clock signal CLK and generates clock signals CLK1F, CLK1S. The clock signal generating circuit 22' delays the clock signals CLK1F, CLK1S and generates clock signals CLK2F, CLK2S. of the result is that the clock signals CLK2F, CLK2S are generated prior to their generation by the clock signals generating circuit 22 shown in FIG. 3. The latency signal LAB generating circuit 26 generates the latency signal LAB responsive to a rising edge of a third clock of the clock signal CLK2F after the read command is applied. The on time control signal PTRST generating circuit 28 generates the on time control signals PTRSTF, PTRSTS responsive to the latency signal LAB and the third clock signals CLK2F, CLK2S. Generation of the latency signal LAB and the on time control signals PTRSTF, PTRSTS in the semiconductor memory device in accordance with the present invention the conventional semiconductor memory device. That is, in accordance with the present invention, by advancing the generation timing of the third clock signals CLK2F, CLK2S, the generation timing of the on time control signals PTRSTF, PTRSTS in FIG. 7 is advanced too. Thus, the on time control signals PTRSTF, PTRSTS in FIG. 7 is generated at a timing earlier than the generation timing of the same signal in FIG. 4A. The latch clock signal generating circuit 24 generates the latch clock signals CLKDQF, CLKDQS responsive to the clock signals CLK1F, CLK1S and the latency signals CL1.5, CL2, CL2.5, CL3. The generation timing of the latch clock signals CLKDQF, CLKDQS is the same as that in FIG. 4A.

The semiconductor memory device in accordance with the present invention is able to output the data correctly even in the high frequency operation by generating the clock signals CLK2F, CLK2S and therefore generating the on time control signals earlier than the latch clock signals CLKDQF, CLKDQS by a time T3. In the embodiment of the present invention described above, the generation paths of the clock signals CLK2F, CLK2S of the clock signal generating circuit is differently constructed for the high frequency operation.

Further, the generation paths of the clock signals CLK2F, CLK2S of the clock signal generating circuit may be differently constructed by using not CAS latency signals but other signals for identifying the high frequency operation and the low frequency operation.

Accordingly, the inventive semiconductor memory device and its associated data read method can read data exactly and correctly since the on time control signal is always generated earlier than the latch clock signal even when the operational frequency varies.

I claim:

1. A semiconductor memory device, comprising:
a data output buffer adapted to receive input data responsive to an on time control signal and adapted to buffer the input data responsive to a latch clock signal;
a first clock signal generating means adapted to generate a first clock signal responsive to a reference signal;
a second clock signal generating means adapted to generate a second clock signal responsive to the first clock signal and a mode signal;
a latency signal generating means adapted to generate a latency signal responsive to the mode signal;
a latch clock generating means adapted to generate the latch clock signal responsive to the second clock signal and the mode signal; and
an on time control signal generating means adapted to generate the on time control signal responsive to the second clock signal and the latency signal.

2. The semiconductor memory device of claim 1
where the second clock signal generating means is adapted to generate the second clock signal responsive to a falling edge of the first clock signal when the device operates at low frequency; and
where the second clock signal generating means is adapted to generate the second clock signal by buffering and delaying the first clock signal when the device operates at high frequency.

3. The semiconductor memory device of claim 1
where the second clock signal generating means is adapted to operate differently when the device operates at a low frequency than when the device operates at a high frequency.

4. The semiconductor memory device of claim 1 where the second clock generating means comprises:
a pulse signal generating means adapted to generate a pulse signal responsive to a falling edge of the first clock signal;
a first delay means adapted to generate a first delay signal by delaying the first clock signal by a first predetermined time;
a switching means adapted to generate a switching signal by transmitting the pulse signal when the device operates at low frequency or the delayed first clock signal when the device operates at high frequency; and
a second delay means adapted to delay the switching signal by a second predetermined time.

5. The semiconductor memory device of claim 4 where the pulse signal generating means comprises:
an inverting means adapted to generate an inverted first clock signal by inverting the first clock signal;
a third delay means adapted to generate a delayed inverted first clock signal by delaying the inverted first clock signal by a predetermined third time;
a first logic means adapted to generate a first logic signal by logically manipulating the delayed inverted first clock signal and the inverted first clock signal; and
a second logic means adapted to generate a second logic signal by logically manipulating the first logic signal with the inverted first clock signal.

6. The semiconductor memory device of claim 5 where the switching means comprises:
a first transmission gate adapted to transmit the second logic signal responsive to the mode signal; and
a second transmission gate adapted to transmit the first delay signal responsive to the mode signal.

7. The semiconductor memory device of claim 5
where the first and third predetermined times are about equal; and
where the second predetermined time is longer than the first predetermined time.

8. A semiconductor memory device, comprising:
- a data output buffer adapted to receive input data responsive to an on time control signal and adapted to buffer the input data responsive to a latch clock signal;
- a first clock signal generating means adapted to generate a first clock signal responsive to an external clock signal;
- a second clock signal generating means adapted to generate a second clock signal responsive to the first clock signal, the second clock signal generating means adapted to output a pulse signal responsive to a high frequency mode signal or output a buffered and delayed version of the first clock signal responsive to a low frequency mode signal;
- a latency signal generating means adapted to generate a latency signal responsive to the mode signal;
- a latch clock generating means adapted to generate the latch clock signal responsive to the second clock signal and the mode signal; and
- an on time control signal generating means adapted to generate the on time control signal responsive to the second clock signal and the latency signal.

9. The semiconductor memory device of claim 8 where the second clock signal generating means comprises:
- a pulse signal generating means adapted to generate the pulse signal responsive to a falling edge of the first clock signal;
- a first delay means adapted to generate the buffered and delayed version of the first clock signal by buffering and delaying the first clock signal by a first predetermined time;
- a switching means adapted to generate a switching signal by transmitting the pulse signal when the device operates at low frequency or the buffered and delayed version of the first clock signal when the device operates at high frequency; and
- a second delay means adapted to delay the switching signal by a second predetermined time.

10. The semiconductor memory device of claim 9 where the pulse signal generating means comprises:
- an inverting means adapted to generate an inverted first clock signal by inverting the first clock signal;
- a third delay means adapted to generate a delayed inverted first clock signal by delaying the inverted first clock signal by a predetermined third time;
- a first logic means adapted to generate a first logic signal by logically manipulating the delayed inverted first clock signal and the inverted first clock signal; and
- a second logic means adapted to generate a second logic signal by logically manipulating the first logic signal with the inverted first clock signal.

11. The semiconductor memory device of claim 9 where the switching means comprises:
- a first transmission gate adapted to transmit the second logic signal responsive to the mode signal; and
- a second transmission gate adapted to transmit the first delay signal responsive to the mode signal.

12. A semiconductor memory device, comprising:
- a pulse signal generating circuit adapted to generate a pulse signal responsive to a falling edge of a first clock signal;
- a first delay adapted to generate a first delay signal by delaying the first clock signal by a first predetermined time;
- a switch adapted to generate a switch signal by transmitting the pulse signal when the device operates at low frequency or the first delay signal when the device operates at high frequency; and
- a second delay adapted to delay the switch signal by a second predetermined time.

13. The semiconductor memory device of claim 12 where the pulse signal generating circuit comprises:
- an inverter adapted to generate an inverted first clock signal by inverting the first clock signal;
- a third delay adapted to generate a third delay signal by delaying the inverted first clock signal by a predetermined third time;
- a first logic gate adapted to generate a first logic signal by logically manipulating the third delay signal and the inverted first clock signal; and
- a second logic gate adapted to generate a second logic signal by logically manipulating the first logic signal with the inverted first clock signal.

14. The semiconductor memory device of claim 12 where the switch comprises:
- a first transmission gate adapted to transmit the second logic signal responsive to the mode signal; and
- a second transmission gate adapted to transmit the first delay signal responsive to the mode signal.

15. The semiconductor memory device of claim 12
- where the first and third predetermined times are nearly identical; and
- where the second predetermined time is longer than the first predetermined time.

16. A method for reading data from a semiconductor memory device, comprising:
- generating a first clock signal responsive to an externally applied clock signal;
- generating a second clock signal responsive to a mode signal, the mode signal indicating whether the device operates at a high or low frequency;
- generating a latch clock signal responsive to the second clock signal and the mode signal;
- generating an on time control signal responsive to a latency signal; and
- reading the data responsive to the second clock signal and the on time control signal.

17. The method of claim 16 where generating a second clock signal comprises:
- providing a pulse signal when the device operates in the low frequency; and
- providing a delayed signal when the device operates in the high frequency.

18. The method of claim 16
- where providing the pulse signal comprises detecting a falling edge of the first clock signal; and
- where providing the delayed signal comprises buffering and delaying the first clock signal.

* * * * *